United States Patent
Kobayashi et al.

(10) Patent No.: US 6,536,013 B2
(45) Date of Patent: Mar. 18, 2003

(54) MEMORY EMBEDDED SEMICONDUCTOR INTEGRATED CIRCUIT AND A METHOD FOR DESIGNING THE SAME

(75) Inventors: Toshio Kobayashi, Kanagawa (JP); Naoshi Ikeda, Kanagawa (JP)

(73) Assignee: Sony Corporation (JP)

( * ) Notice: Subject to any disclaimer, the term of this patent is extended or adjusted under 35 U.S.C. 154(b) by 98 days.

(21) Appl. No.: 09/730,737

(22) Filed: Dec. 7, 2000

(65) Prior Publication Data

US 2001/0044923 A1 Nov. 22, 2001

(30) Foreign Application Priority Data

Dec. 9, 1999 (JP) .............................. 11-350125

(51) Int. Cl.⁷ .............................................. G06F 17/50
(52) U.S. Cl. .............................................. 716/1; 716/19
(58) Field of Search .............................. 716/1, 2, 5, 19, 716/10, 12, 14; 705/400, 401; 326/10, 9, 8

(56) References Cited

U.S. PATENT DOCUMENTS

| | | | |
|---|---|---|---|
| 4,727,493 A | * 2/1988 | Taylor, Sr. ........................ | 716/12 |
| 5,532,934 A | * 7/1996 | Rostoker ........................ | 716/10 |
| 5,960,185 A | * 9/1999 | Nguyen ........................ | 716/14 |
| 6,215,327 B1 | * 4/2001 | Lyke ........................ | 326/10 |
| 6,249,776 B1 | * 6/2001 | Bajuk et al. ........................ | 705/400 |
| 6,324,527 B1 | * 11/2001 | Bajuk et al. ........................ | 705/400 |

\* cited by examiner

*Primary Examiner*—Vuthe Siek
*Assistant Examiner*—Binh C. Tat
(74) *Attorney, Agent, or Firm*—Rader, Fishman & Grauer PLLC; Ronald P. Kananen, Esq.

(57) ABSTRACT

The present invention clarifies the conditions for the required element techniques to be technically superior and makes it easy to establish the development guideline during the development of a memory embedded semiconductor integrated circuit. The total resource CW of a fabrication technique is defined by utilizing the process number or mask number, etc., required for the fabrication; and the unit resource CWU is deduced by dividing the total resource CW with the effective wafer area; and the unit resource CWU multiplied by the area of the logic gate forming region is defined as the first effective technique resource CWL; that multiplied by the area of the memory cell forming region is defined as the second effective technique resource CWAM, that multiplied by the area of other regions is defined as the third effective technique resource CWP&IO; a plurality of techniques concerning the fabrication and/or design are compared by using the first to the third effective technique resources obtained as the above techniques are applied to, and from these techniques, those suitable to the required scales of the memory and the logic circuit are selected.

14 Claims, 11 Drawing Sheets

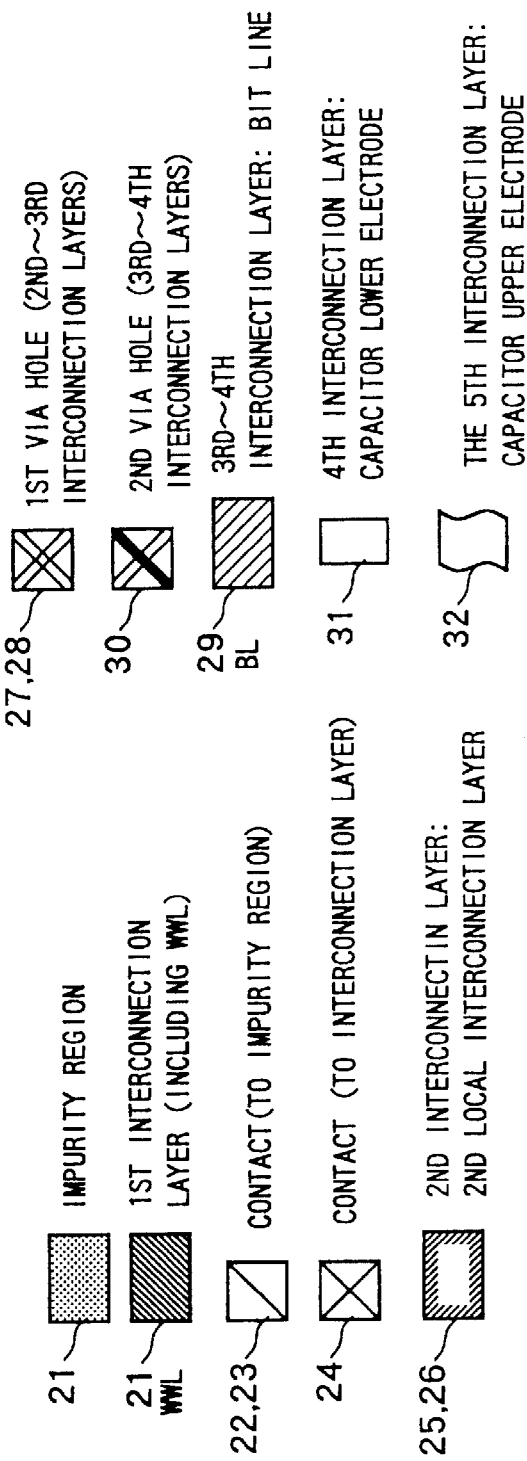
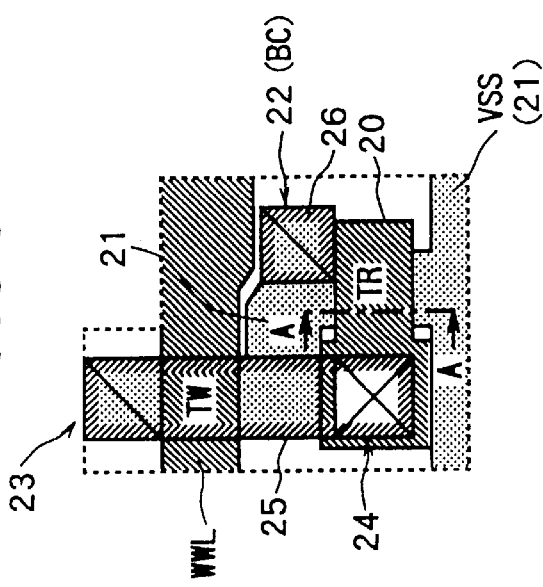

MEMORY EMBEDDED SEMICONDUCTOR INTEGRATED CIRCUIT AND A METHOD FOR DESIGNING THE SAME

BACKGROUND OF THE INVENTION

1. Field of the Invention

The present invention relates to a method for designing a memory embedded semiconductor integrated circuit, which clarifies the conditions that ought to be fulfilled by superior designs/fabrication techniques, and enables selection from a number of techniques the ones suitable to the scales of the memory and the logic circuit during the development of a memory embedded logic LSI, as well as a memory embedded semiconductor integrated circuit as an application of the same method.

2. Description of the Related Art

As memory cells able to be integrated (embedded) in one chip together with logic gates, there exist chiefly SRAM cells and DRAM cells. In addition, there also exist other such types of memory cells, such as three transistor type memory cells, and various nonvolatile memory cells.

The type of memory cell is one of the element techniques that ought to be selected, or ought to be developed when a memory embedded LSI is developed.

However, when a memory embedded LSI is designed or developed, clear criteria does not exist concerning the questions of under what conditions a certain technique is superior to others, and what superior techniques are.

Concerning the memory LSI for exclusive use, such as DRAM, etc., all efforts have been devoted to reducing the cell size provided that the fabrication processes are not made too sophisticated.

On the other hand, for the memory embedded LSI, the consistency with logic processes also should be considered in addition to the balance between reducing the cell area and avoiding the sophistication of fabrication processes, just like the memory LSI for exclusive use.

In practice, because there are not definite criteria about which technique should be selected, in many cases, selections have been made solely relying on the experiences of developers. In addition, when a new element technique is developed, the rich experiences and high degree decisions of the developers are required, for example, to decide definitely where to attain the balance between the cell area and process simplification.

Concerning the development of memory embedded LSI, there also are other subjects in addition to attaining a balance between reducing the cell area and securing the consistency of processes.

For example, in a nonvolatile memory, it is still a problem that should be solved that there are not definite guidelines for attaining the balance between the process consistency and the transistor's structure parameters and size, which are concerned with the characteristics of high speed transistors used in logic circuit, and high voltage resistance transistors and low voltage resistance transistors used in memory transistors and memory peripheral circuits.

SUMMARY OF THE INVENTION

An object of the present invention is to provide a method for designing a memory embedded semiconductor integrated circuit, the same method clarifying the conditions for the element techniques to be technically superior, and making it easy to establish the guideline for selecting the superior techniques, thus enabling easy developments during the development of a memory embedded semiconductor integrated circuit, and to provide a memory embedded semiconductor integrated circuit which fulfills the requirements of technique superiority, as an application of the same method.

According to a first aspect of the present invention, there is provided a method for designing a memory embedded semiconductor integrated circuit having a first region where logic gates are formed, a second region where memory cells are formed, and a third region including all other regions but the first region and the second region, the method comprising the steps of: defining a total resource of a fabrication technique by utilizing various numerical values represented by the process number or mask number required for fabricating the memory embedded semiconductor integrated circuit; deducing a unit resource by dividing the total resource by the effective wafer area; defining a first effective technique resource, a second effective technique resource, and a third effective technique resource by multiplying the unit resource by the area of the first region, the area of the second region, and the area of the third region, respectively; comparing a plurality of techniques concerning fabrication and/or design by using the first to the third effective technique resources obtained as these techniques are employed; and selecting from the plurality of techniques those suitable to the required scales of the memory and the logic circuit.

Preferably, the method comprises the steps of: subtracting the effective technique resources of the technique for comparison from the effective technique resources of the technique under investigation and deducing the differences with respect to each of the first to the third effective technique resources; and adopting the technique under investigation under the condition that the sum of the differences over the first to the third regions is negative.

Specifically, the method comprises the steps of: denoting the following equation (1) by the following procedures;

$$[CWU(n) \times SPLG(n) - CWU(i) \times SPLG(i)] \times \\ NLG + [CWU(n) \times SPB(n) - CWU(i) \times SPB(i)] \times \\ NMB + [CWU(n) \times SP\&IO(n) - CWU(i) \times SP\&IO(i)] < 0 \qquad (1)$$

by CWU(n) the unit resource obtained by dividing the total resource of the fabrication technique by the effective wafer area when the memory embedded semiconductor integrated circuit is fabricated by using technique N that is under investigation, by CWU(i) the unit resource when performing fabrication using the i-th technique I among a number of m (m: a natural number) techniques that are for comparison, by SPLG(n) the area per logic gate in the first region when technique N is employed, by SPLG(i) the area per logic gate in the first region as technique I is employed, by SPB(n) the area per memory bit in the second region as technique N is employed, by SPB(i) the area per memory bit in the second region as technique I is employed, by SP&IO(n) the area of the third region as technique N is employed, by SP&IO(i) the area of the third region as technique I is employed, by NLG the total number of the logic gates in the first region, and by NMB the total number of the memory bits in the second region; and adopting the technique N under the condition of satisfying the equation (1).

The method comprises a step of adopting the technique N under the condition of satisfying the equation (2), replacing equation (1), $$[CWU(n) - CWU(i)] \times SPLG \times NLG + \qquad (2)$$
$$[CWU(n) \times SPB(n) - CWU(i) \times SPB(i)] \times NMB + [CWU(n) \times$$
$$SP\&IO(n) - CWU(i) \times SP\&IO(i)] < 0$$

when the areas per logic gate SPLG(n) and SPLG(i) being equal, and denoting this area by SPLG.

Furthermore, the method comprises the steps of: denoting the area of the third region by SP&IO when SP&IO(n) is equal to SP&IO(i); and adopting the technique N under the condition of satisfying the equation (3), replacing equation (1), $$[CWU(n) \times SPLG(n) - CWU(i) \times SPLG(i)] \times \qquad (3)$$
$$NLG + [CWU(n) \times SPB(n) - CWU(i) \times SPB(i)] \times$$
$$NMB + [CWU(n) - CWU(i)] \times SP\&IO(NLG, NMB) < 0$$

when there are almost not differences in the scales of the logic on board in the first region and in the capacities of the memories on board in the second region, no matter which of technique N and technique I is employed.

On the other hand, the method comprises the steps of: denoting the area of the third region by SP&IO when SP&IO(n) is equal to SP&IO(i); and adopting the technique N under the condition of satisfying the equation (4), replacing equation (2), $$[CWU(n) - CWU(i)] \times SPLG \times NLG + \qquad (4)$$
$$[CWU(n) \times SPB(n) - CWU(i) \times SPB(i)] \times$$
$$NMB + [CWU(n) - CWU(i)] \times SP\&IO(NLG, NMB) < 0$$

when there are almost not differences in the scales of the logic on board in the first region and in the capacities of the memories on board in the second region, no matter which of technique N and technique I is employed.

In the present method for designing a memory embedded semiconductor integrated circuit, the total resource is defined as a quantitative quantity to express the scale of the technique for fabricating the memory embedded semiconductor integrated circuit. Those may be used as the total resource are, for example, the process number and the mask number, etc., which are required for fabricating chips of a memory embedded semiconductor integrated circuit. The total resource also may be defined by using the weighted average process number and mask number, for example, by giving a weight to a mask number according to the process number existing after a certain process that uses masks and before the next process that uses masks.

Next, the resource for fabricating a chip of unit area is deduced by dividing the total resource by the effective wafer area. This resource is called unit resource. The unit resource multiplied by the areas of the first region (logic region), the second region (memory region), or the third region (other region) are the first to the third effective technique resources, respectively.

Then, the technique superiority is compared by employing the first to the third effective technique resources. Specifically, there is a technique N that ought to be investigated; and use I to represent any other existing technique used for comparison. There may be a number of techniques I for comparison. For example, compare technique N under investigation and technique I for comparison by using the first to the third effective technique resources. This comparison result enables the analysis of in what aspects technique N under investigation is superior to technique I for comparison. Namely, since evaluation using the effective technique resources can be performed for each functional block in a memory embedded semiconductor integrated circuit, the technical problems that should be solved and the effects of improvements can be easily estimated.

Next, the effective technique resources as technique I for comparison is employed are subtracted from the effective technique resources as technique N under investigation is employed, and the differences are deduced; for example, the condition for technique N to be adopted is that the sum of these differences is negative. This result enables a easy judgment and selection of a technique N that is superior to technique I for comparison.

According to a second aspect of the present invention, there is provided a memory embedded semiconductor integrated circuit comprising: a first region wherein a logic gate array is formed; a second region; wherein a memory cell array is formed; and a third region other than the first region and the second region, and wherein the circuit fulfills the condition of satisfying the equation (1), that is, $$[CWU(n) \times SPLG(n) - CWU(i) \times SPLG(i)] \times \qquad (1)$$
$$NLG + [CWU(n) \times SPB(n) - CWU(i) \times SPB(i)] \times$$
$$NMB + [CWU(n) \times SP\&IO(n) - CWU(i) \times SP\&IO(i)] < 0$$

where,

CWU(n) denotes the unit resource, which is defined as the division by the effective wafer area of the fabrication technique total resource represented by the process number and/or the mask number required for fabricating the memory embedded semiconductor integrated circuit using technique N that is under investigation, CWU(i) denotes the unit resource when using for fabrication the ith technique I among a number of m (m: a natural number) techniques that are for comparison, SPLG(n) is the area per logic gate of the first region as technique N is employed, SPLG(i) is the area per logic gate of the first region as technique I is employed, SPB(n) is the area per memory bit of the second region as technique N is employed, SPB(i) is the area per memory bit of the second region as technique I is employed, SP&IO(n) is the area of the third region as technique N is employed, SP&IO(i) is the area of the third region as technique I is employed, NGL is the total number of the logic gates in the first region, and NMB is the total number of the memory bits in the second region.

BRIEF DESCRIPTION OF THE DRAWINGS

These and other objects and features of the present invention will become clearer from the following description of the preferred embodiment given with reference to the accompanying drawings, in which:

FIG. 8 consisting of FIGS. 8A and 8B, is a plain view showing examples of the practical configurations and patterns of two transistor —one capacitor type cells;

DESCRIPTION OF THE PREFERRED EMBODIMENTS

Below, preferred embodiments will be described with reference to the accompanying drawings.

In the present embodiment, while the conditions for ensuring technique superiority are investigated by proposing a criterion, a specific example of a superior technique is shown. Due to this, a new method is provided for predicting the selection of techniques and the direction of development. In addition, in the field of memory embedded logic LSI techniques, superior techniques do not only depend on the reduction of memory cell size, but the also depend on the area of the direct-used peripheral circuits for a memory, the area of the I/O and pad region, and, further, the scale of the logic gate on board and the capacity of the memory on board. It is clarified that it is necessary to select the most suitable technique with respect to the combination of the above factors.

First, the notations used in the present embodiment are listed and explained below.

| | |
|---|---|
| CWL: | The process number or mask number, etc., required for fabricating the logical functional part in a memory embedded LSI, referred to as the first effective technique resource. |
| CWAM: | The process number or mask number, etc., required for fabricating the memory part in a memory embedded LSI [or the additional part to the process number (or mask number) of the fabrication of the logical functional part], referred to as the second effective technique resource. |
| CWP&IO: | The process number or mask number, etc., required for fabricating the part including I/O pads, peripheral circuits, and I/O circuits in a memory embedded LSI, referred to as the third effective technique resource. |
| CW: | The process number or mask number, etc., required for fabricating an LSI by a embedded memory process (CW = CWL + CWAM + CWP&IO), referred to as the total resource. |
| CWU: | The process number or mask number, etc., required for fabricating a chip of unit area, referred to as unit resource. Here, CWU = CW/SEW [effective wafer area], namely, CWU multiplied by area S is the effective technique resource required for fabricating a chip of area of S. |
| NLG: | The number of logic gates on board. |
| NMB: | Scale of the embedded memory (bit number). |
| NC: | Effective number of chips in one wafer (NC = SEW/SC). |
| SPMC: | Area of a memory cell. |
| SMC: | Area of the memory cell region (SMC = SPMC × NMB). |
| SPB: | Area per bit. |
| SM: | Area of the memory region in a chip (The direct-used peripheral circuits of the memory is included in SM, SM = SPM × NMB). |
| SL: | Area of the logic region in a chip. |
| SPLG: | Area per logic gate (SL = SPLG × NLG). |
| SP&IO: | Area of the I/O and pad region in a chip. |
| SEM: | Area of regions other than the memory region (SEM = SL + SP&IO). |
| SC: | Chip area (SC = SM + SEM). |
| SEW: | Effective area of a wafer (SEW = SC × NC). |

Figure 1:
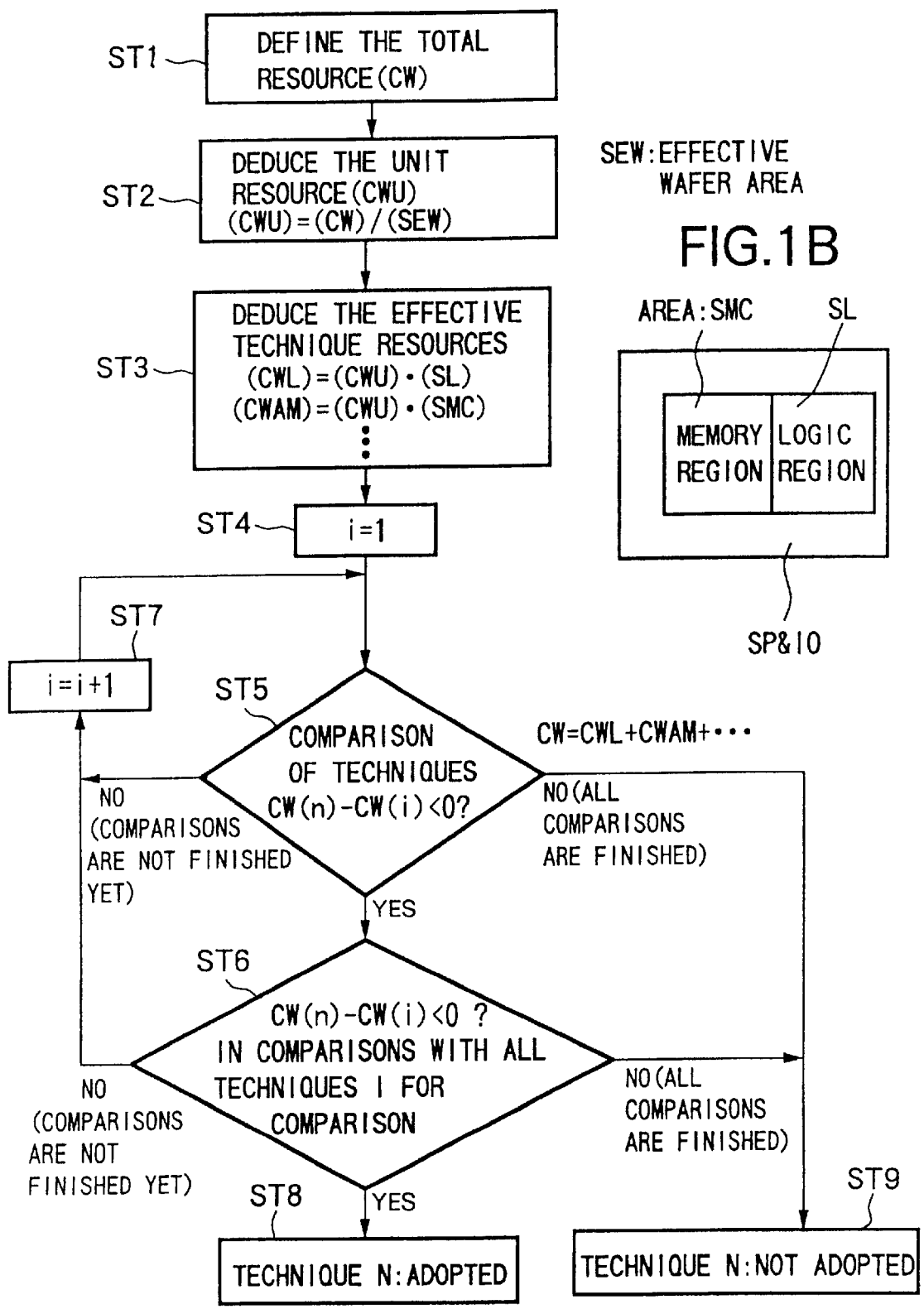
FIG. 1A is a flow chart of the procedure of investigating the technique superiority in design of a memory embedded semiconductor integrated circuit according to the present embodiment.
FIG. 1B is a schematic drawing of a memory embedded semiconductor integrated circuit.

FIG. 1 is a flow chart showing the procedure of investigating the technique superiority in design of a memory embedded semiconductor integrated circuit according to the present embodiment. Here, in the present embodiment, a memory cell type technique is taken for the example of the technique under superiority evaluation concerning the design/fabrication of a memory embedded semiconductor integrated circuit, and with respect to the technique N (memory cell), techniques of a DRAM cell and an SRAM cell are used as the existing techniques I (with which comparison is made).

First, in step ST1, the total resource (CW) is defined. Here, the mask number is used as the total resource (CW).

Take the logic LSI process as a standard process, that is, it is a common process that is required no matter what kinds of memories are integrated in the embedded IC. Assume the logic LSI process is a five-layer interconnection process, and the number of masks is 25, so the total resource (CW)=25.

In step ST2, the total resource (CW) is divided by the effective wafer area (SEW), and the unit resource CWU is obtained. That is, $$(CWU)=(CW)/(SEW).$$

In step ST3, the effective technique resource is deduced in each of the first region (logic region), the second region (memory region), and the third region (other regions), respectively. Here, the effective technique resource of the logic region is referred to as the first effective technique resource (CWL), the effective technique resource of the memory region is referred to as the second effective technique resource (CWAM), and the effective technique resource of other regions is referred to as the third effective technique resource (CWP&IO).

These effective technique resources can be deduced by multiplying the unit resource (CWU) with their areas (SL), (SMC), and (SP&IO), respectively.

Namely, (CWL)=(CWU)×(SL)

(CWAM)=(CWU)×(SMC)

(CWP&IO)=(CWU)×(SP&IO)

In the following, an explanation is given by raising a specific example.

Generally, an area of about $300F^2$ is needed to construct one logic gate. Here, F is the minimum size of a pattern, so an area of $300F^2$ indicates that the area required for constructing one logic gate is 300 times the square of the minimum size.

Assume the SRAM takes the form of six transistors, and the cell area is about $130F^2$. Generally, the area of peripheral circuits is about 30% of the cell area, hence, an area of about $169F^2$ is needed to construct one bit. When the SRAM takes the form of six transistors, because memory cells can be made at the same time as the logic process, the mask number need not be increased.

On the other hand, DRAM has a cell area of $12F^2$, and the area of peripheral circuits is roughly the same as the cell area. Therefore, an area of about $24F^2$ is needed to construct one bit. Mask number need to be increased by 50%; take it as 37.

In a practical LSI chip, in addition to the logic region (area: SL) and the memory region (area: SM), the third region containing I/O pads and I/O circuits, etc. is also indispensable. Here, as shown in FIG. 1B, at the center of a LSI chip, the logic region and the memory region together forms nearly a square, and a frame of 0.6 mm is provided around its sides, taken as the third region. In the third region (area: SP&IO), I/O circuits and I/O pads are arranged. Of course, although the width of the frame is set to be 0.6 mm here, in accordance with the purpose and application, this width may be changed.

In step ST4 and thereafter, a method is to be presented of comparing the ith technique I in a number of m existing techniques with technique N, while changing the existing technique one after another. Prior to this work, an attempt was made at making a comparison between existing techniques.

If a memory embedded logic LSI was fabricated, which had a scale of the logic on board of 10 Kgate to 2.56 Mgate and a capacity of the memory on board of 1 Mbit to 56 Mbit, the effective technique resource CW(i), that is, CWU(i)·SPLG(i)·NLG +CWU(i)·SPB(i)·NMB +CWU(i)·SP&IO(i)

were deduced and a comparison was made between i=1 (SRAM) and i=2(DRAM).

For simplicity, it was assumed that the area of the logic circuit as SRAM was embedded SPLG(1) was equal to the area of the logic circuit as DRAM was embedded SPLG(2), and SPLG stood for this area.

Figure 2:
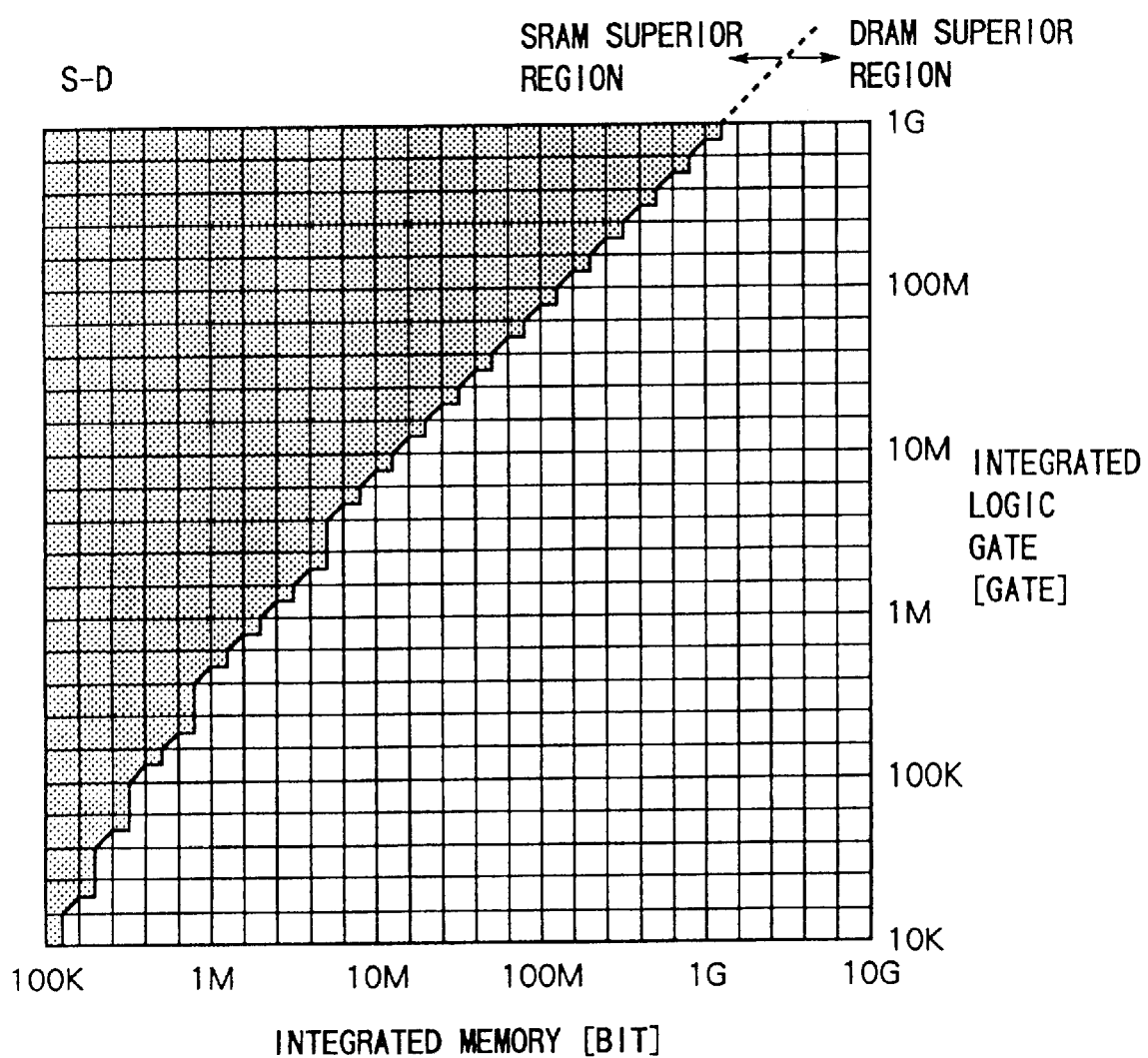
FIG. 2 is a plot showing the possible SRAM superior region and the possible DRAM superior region, with the horizontal axis and the vertical axis being the scales of the logic on board and the capacity of the memory on board, respectively.

FIG. 2 shows the comparison between the effective technique resources of two techniques of embedded SRAM and of embedded DRAM, with the horizontal axis being the scale of the memory on board, and the vertical axis being the scale of the logic on board.

As shown in FIG. 2, compared with the effective technique resource of SRAM, the effective technique resource of DRAM has relatively small values in the right bottom region in the plot (DRAM superior region), while the effective technique resource of SRAM has relatively small values in the left top region in the plot (SRAM superior region). In such a way, by using the concept of effective technique resource spoken of to make a comparison, the region where SRAM memory cell is superior can be clearly distinguished from the region where DRAM memory cell is superior, in accordance with the scale of the memory on board and the scale of the logic on board. Further, even though not able to be shown in FIG. 2, because the effective technique resource can be expressed using three terms related to the first to the third regions, the grounds for their superiority or inferiority, namely, the advantage and the disadvantage of each memory cell, become clear.

In such a way, according to the procedure in FIG. 1, because an evaluation can be performed using the effective technique resources for each functional block in a memory embedded LSI, the technique problems that should be solved and the effects of improvements can be predicted easily.

Next, by using such a map of technique superiority of SRAM and DRAM, it is investigated if any other memory cell else having certain scales of memory and logic is superior with respect to SRAM and SRAM, respectively. As done above, for simplicity, it is assumed that the same standard logic process as the SRAM or DRAM embedded LSI is employed for the LSI with the memory cell under investigation on board, therefore, the area of the logic region in the LSI with the memory cell under investigation on board SPLG(n) is equal to that of the SRAM or DRAM embedded LSI, and use SPLG to represent this area.

As an example, assume the increment of the mask number required for the embedded memory is three relative to the standard logic LSI process, and the cell area is $18F^2$ (1.5 times as that DRAM, and 18/130 times that of SRAM), the area of the direct-used peripheral circuits for the memory is 1.2 times that of DRAM, namely, the memory cell technique that requires an area of about $32.4F^2$ to construct one bit is being investigated. Give the technique a temporary name "NewCell(1)".

The sum of the effective technique resources for each functional block in a memory embedded LSI fabricated by using the NewCell(1) technique, CW(n1) can be expressed as, CW(n1)=CWU(n1)·SPLG(n1)·NLG +CWU(n1)·SPB(n1)·NMB +CWU(n1)·SP&IO(n1)

where "n1" is a notation indicating NewCell (1).

Figure 3:
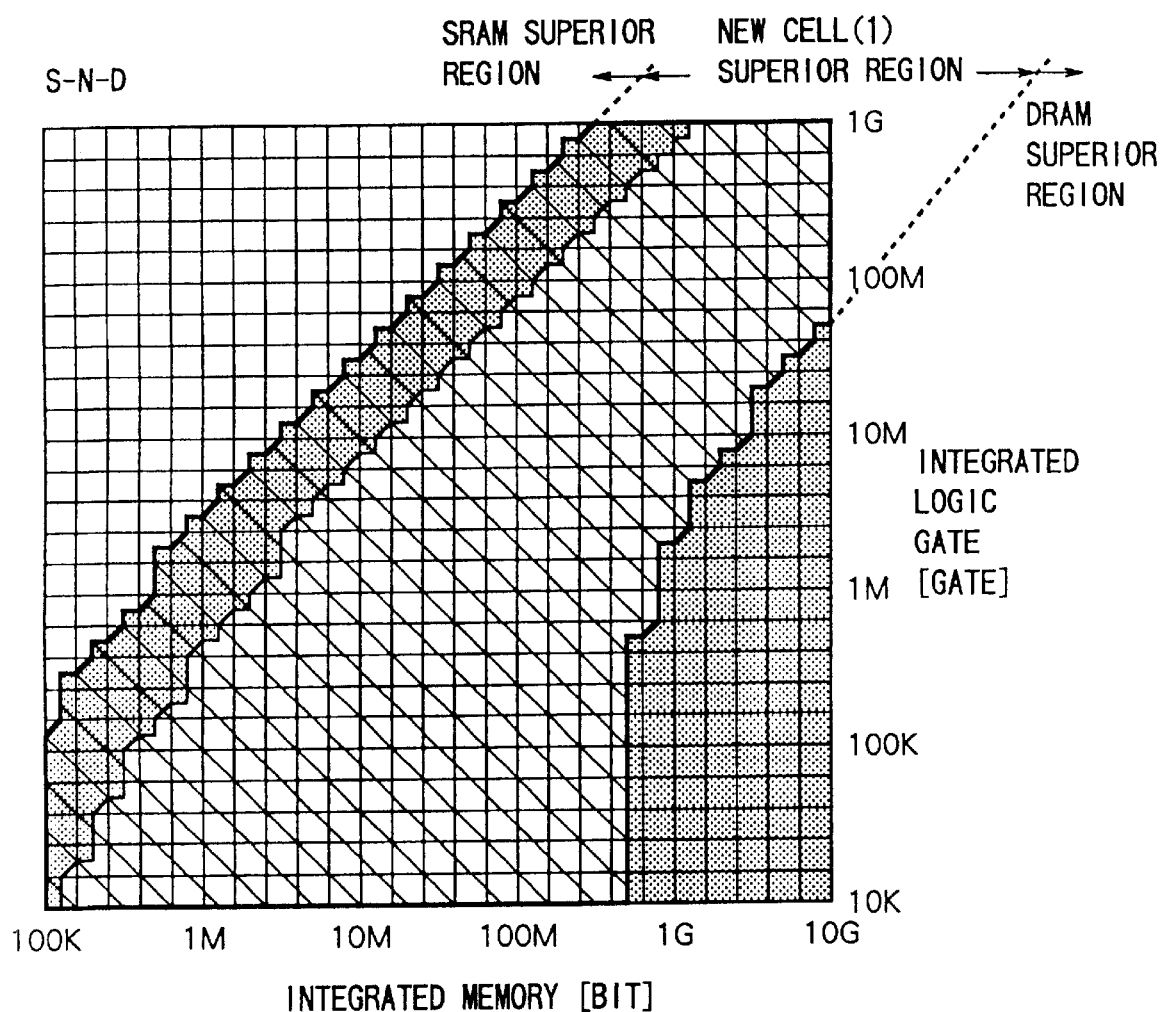
FIG. 3 is a plot in which the NewCell(1) superior region is overlapped on FIG. 2.

The region in which the sum of effective technique resources CW(n1) is smaller than the sum of effective technique resources of the SRAM or DRAM embedded LSI, CW(1), CW(2), that is, NewCell(1) technique is superior (NewCell(1) superior region), is found and is overlapped on the SRAM or DRAM superiority map (FIG. 2), as shown in FIG. 3.

As shown in FIG. 3, the NewCell(1) superior region comes between the SRAM superior region and the DRAM superior region. In addition, it is found that the NewCell(1) is superior to SRAM and DRAM with the scale of logic on board in the range of 10 KGate to 2.5 MGate and the capacity of memory on board in the range of 1 Mbit to 256 Mbit.

Concerning the specific procedure of the superiority comparison, in FIG. 1, the method of comparing each two techniques one by one is adopted. In order to show the comparison of techniques in the design process, the necessary logic circuit scale and the memory capacity are given a value, respectively, beforehand according to the design specifications of the LSI.

In step ST4, with i=1, namely, make SRAM the technique for comparison, then, in step ST5, it is examined if CW(n1)-CW(1) is negative for specified scales of logic circuit and memory.

If CW(n1)-CW(1) is negative, in step ST6, it will be inquired if the comparisons with all techniques for comparison were performed. Since the comparison with DRAM has not been performed yet, the process proceeds to step ST7, and i is increases by 1. In step ST5, If CW(n1)-CW(1) is positive or zero, and the comparisons with all techniques have not been finished, yet, the process proceeds to step ST7, and i is increased by 1.

After step ST7, the process goes back to the entry of step ST5, and i=2, namely, a comparison with DRAM is to be performed.

Depending on the result of this comparison, if CW(n1)-CW(2) is negative, after confirming all comparisons have been finished in step ST6, in Step ST8, the technique under investigation N (NewCell(1)) is adopted as a technique superior to SRAM and DRAM.

While in step ST5 or Step ST6, if CW(n1)-CW becomes zero at least once, the process proceeds to step ST9, and the technique N under investigation is not adopted.

Shown below is a specific example of the NewCell(1) technique.

Any kind of circuit configuration is able to realize memory functions with an increment of the mask number less than three with respect to the standard logic process.

But if the restriction is imposed on the cell area required for constructing one bit, the increment of the mask number changes. A possible choice of a memory cell with the smallest cell area is the DRAM cell, which is composed of a MOS transistor and a capacitor, having the smallest number of elements to form one bit.

However, a DRAM cell needs a relatively large capacitance, and to make a capacitor with small area and large capacitance requires a capacitor of a complicated three dimensional structure. To make this capacitor of a complicated three dimensional structure, the mask number increases, and it is impossible to make the increment of the mask number less than three.

Further, for an SRAM cell consisting of six MOS transistors, because of the large number of elements, it is impossible to make the cell area small.

The circuit type that has both a small increment of the mask number and a small cell area basically requires that the number of elements be small and the areas of the constitutional elements be able to be made small.

As a memory cell configuration having the second smallest number of elements after the DRAM consisting of one MOS transistor and one capacitor, there exists the gain cell. In a gain cell, the charge stored in a capacitor is not read out directly, the ON/OFF state of the read transistor is controlled according to the amount of charge corresponding to the data stored in capacitors or in the node of write transistor, and the stored data is amplified by read transistor and is read out to the bit line. As typical gain cells, depending on the number of the read transistors (one or two), there are a memory cell configuration consisting of three MOS transistors (three transistor type) and a memory cell configuration consisting of two MOS transistors and one capacitor (two transistor—one capacitor type).

Figure 4:
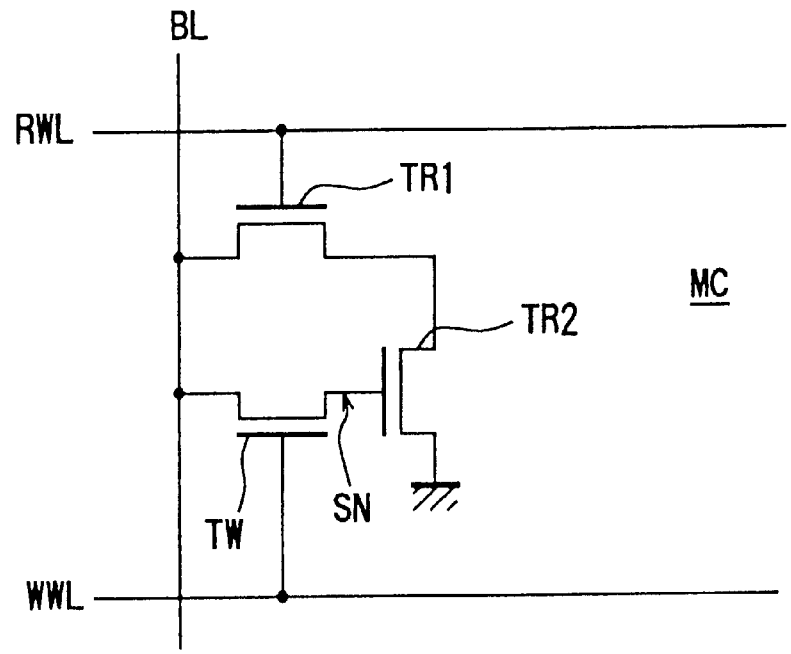
FIG. 4 is a circuit diagram of a three transistor type gain cell as one example of the NewCell technique.
Figure 5:
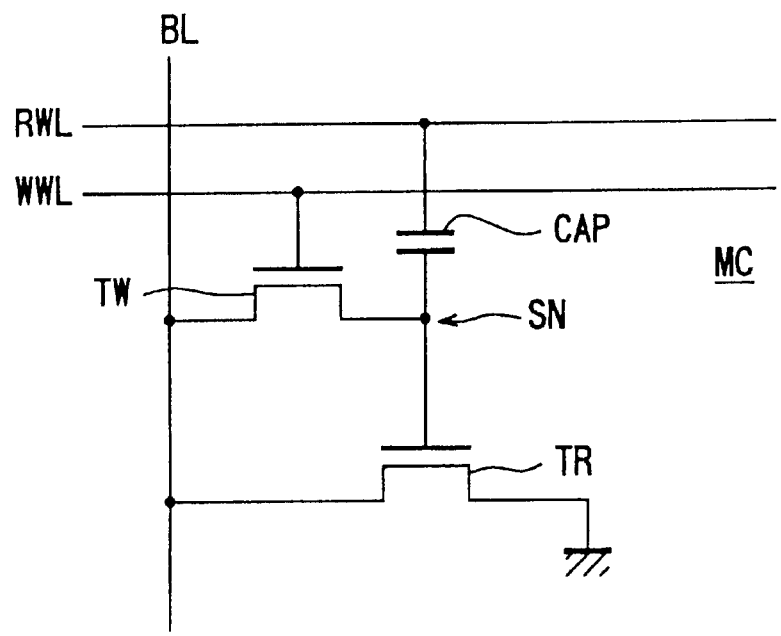
FIG. 5 is a circuit diagram of a two transistor—one capacitor type gain cell as another example of the NewCell technique.

FIG. 4 and FIG. 5 show the circuit diagrams of such typical gain cells.

The gain cell MC in FIG. 4 is a three transistor type gain cell, consisting of one write transistor TW, a first read transistor TR1 and a second read transistor TR2. In the write transistor TW, the gate is connected to the write word line WWL, and one of the source and drain is connected to the bit line BL. In the first read transistor TR1, the gate is connected to the read word line RWL, the drain is connected to the bit line BL, and the source is connected to the drain of the second read transistor TR2. In the second read transistor TR2, the gate is connected to another one of the source and drain of the write transistor TW, the drain is connected to the source of the first read transistor TR1, and the source is connected to the common potential line (for example, grounding line). The connection point of the gate of the second read transistor TR2 and the write transistor TW serves the storage node SN of the memory cell MC.

The gain cell MC in FIG. 5 is a two transistor-one capacitor type gain cell, consisting of one write transistor TW, one read transistor TR and one capacitor CAP. In the write transistor TW, the gate is connected to the write word line WWL, and one of the source and drain is connected to the bit line BL. In the read transistor TR, the gate is connected to another one of the source and drain of the write transistor TW, and the drain is connected to the bit line BL, and the source is connected to the common potential line (for example, grounding line). In the capacitor CAP, one electrode is connected to the connection point of the read transistor TR and the write transistor TW, another electrode is connected to the read word line RWL. The connection point of that one electrode of the capacitor CAP, the read transistor TR and the write transistor TW serves as the storage node SN of the memory cell MC.

In these gain cell MC, in a write operation, the write word line WWL is activated from the low level to the high level, and the write transistor TW is turned on. At this time, the potential of the storage node SN changes in accordance with the voltage set on the bit line.

In a read operation, the bit line is pre-charged in advance by the external power supply and is at, for example, the power supply voltage Vcc. Under this condition, the read word line RWL is activated from the low level to the high level. Depending on the stored data, namely, the potential of the storage node SN, the bit line discharge or just remains at the pre-charged voltage without discharging.

Specifically, if the read word line RWL is set to be at high level, then only when the potential of the storage node SN is at high level, are the read transistors TR1, TR2 of the configuration in FIG. 4 turned on, or is the read transistors TR of the configuration in FIG. 5 turned on. Therefore, the bit line is discharged up to the grounding potential.

On the other hand, when potential of the storage node SN is at low level, because the read transistor TR2 or TR is not on, the bit line does not discharged.

In the read operation, the amplitude of the potential variation of the bit line is, for example, as large as Vcc, and it does not decrease by only miniaturizing the cell size, so in the aspect of circuit configuration, a gain cell has the advantage that malfunctions hardly ever happen.

Further, in a gain cell, it is not necessary to retain inside the cell the charge that alters the potential of the bit line according to the logic of the stored data, therefore, even a capacitor is used, a small capacitance is sufficient. In other words, if charge is retained, the capacitor CAP in FIG. 5 sets the storage node SN electrically floating when the write transistor TW is off, while in a read operation, when the read word line RWL is changed to high level, by capacitive coupling, the capacitor CAP increases the potential of the storage node SN according to the stored data until the potential is sufficient to turn on or off the read transistor TR, therefore, a capacitor of very simple structure and very small area is enough.

In a gain cell of such configuration, a MOS transistor used in a memory cell (the read transistor and the write transistor) and the logic part can be fabricated simultaneously by the standard logic process.

In a three transistor type gain cell, same as the six transistor type SRAM, there is not increase of the mask number owing to the memory embedding. Furthermore, the three transistor type gain cell has only half the number of transistors as the six transistor type SRAM, accordingly, the cell area is considerably small.

In a two transistor—one capacitor type gain cell, due to above reasons, a capacitor with very simple structure and very small area is sufficient, so, the capacitor electrode is made to have the MIM structure that is fabricated at the same time with the multilayer interconnection layer in the logic process, and is able to be stacked above the transistors. In the present case, a least increment of the mask number due to the memory embedding, for example, one, is sufficient. In addition, because the two transistor—one capacitor type gain cell has transistors, which affect the cell area strongly, one less than the three transistor type, a smaller cell area is achievable than the three transistor type.

Figure 6:
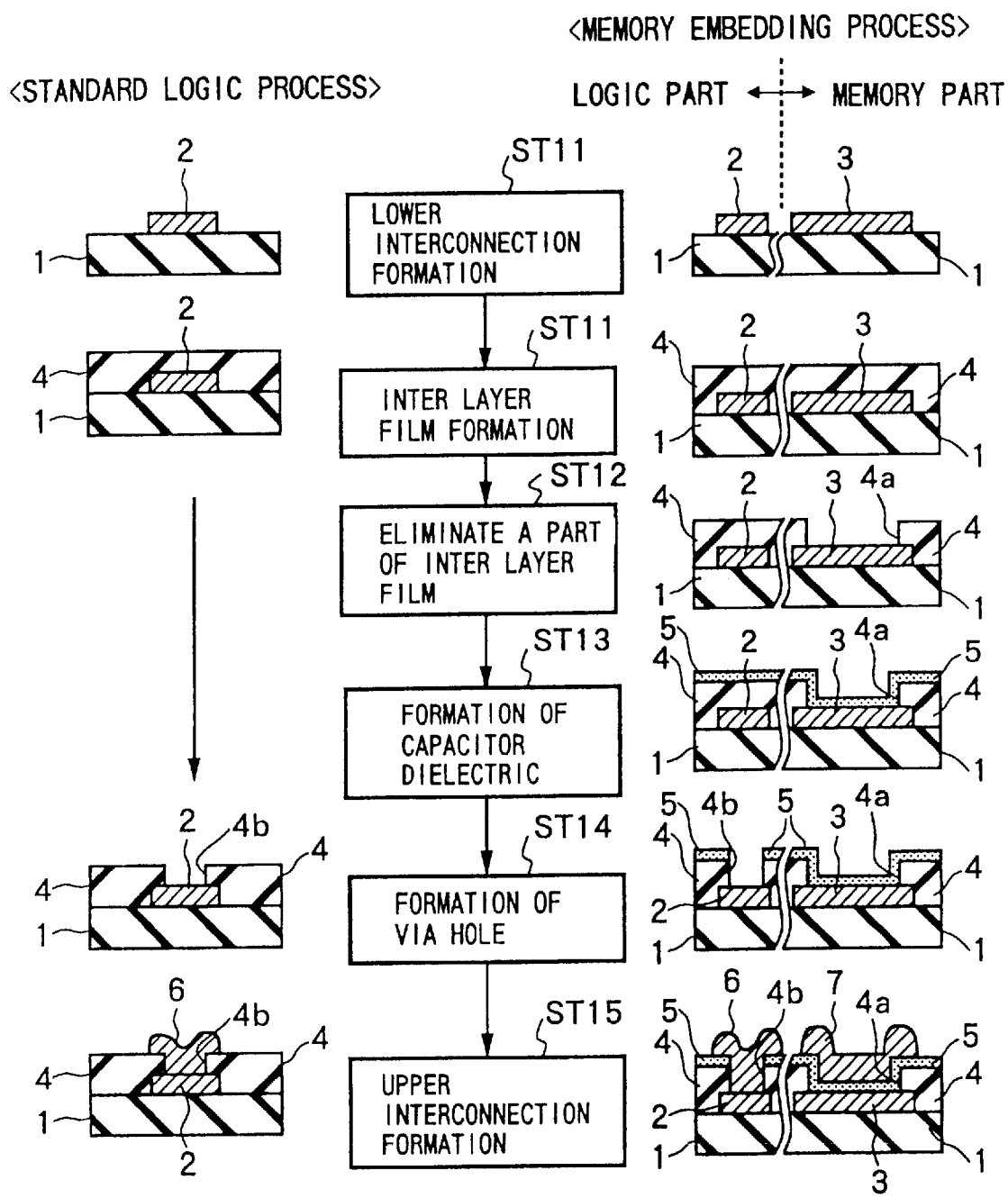
FIG. 6 shows the comparison between the capacitor formation process in the process of fabricating a two transistor—one capacitor type gain cell and the interconnection formation process in a standard logic process.

FIG. 6 shows the comparison between the capacitor formation process in the process of fabricating a two transistor - one capacitor type gain cell and the interconnection formation process in the standard logic process. In FIG. 6, the process flow is shown in the middle, on the left and the right sides are shown the cross-sectional views of the standard logic process in a place of interconnection and the memory embedding process, respectively.

In FIG. 6, "1" indicates the dielectric film covering the MOS transistor formed in the surface of the semiconductor substrate.

In the first process ST10 in which the lower interconnection is formed, the lower interconnection layer 2 that properly connects logic transistors, and the lower electrode of the capacitor 3 are formed simultaneously on the dielectric film 1.

In the process ST11 of the formation of the interlayer film, the lower interconnection layer 2 and the lower electrode of the capacitor 3 are covered by the dielectric film 4 (interlayer film).

In the memory embedding process, as an additional process that is not in the standard logic process, the process ST12 and ST13 are included to eliminate a part of the interlayer film and to form the dielectric film of the capacitor, respectively.

In ST12, the first one of these two processes, a part of interlayer film 4 is eliminated by etching, and an aperture 4a is made, which is slightly smaller the upper surface of 3, the lower electrode of the capacitor. In the next process ST13, the dielectric film 5 of the capacitor is formed on the whole surface including the surface of the interlayer film 4 and the upper surface of the lower electrode 3 that shows up through aperture 4a.

Next, in both the standard logic process and the memory embedding process, a part of the dielectric film on the lower interconnection layer 2 is eliminated, and via hole 4b is formed. At this time, only etching of interlayer film 4 is sufficient in the standard logic process, but in the memory embedding process, first the dielectric film 5 of the capacitor, then the interlayer film 4 are etched using the same mask layer.

At last, with patterns slightly larger than the etching patterns of the interlayer film 4 (4a and 4b), the upper interconnection layer 6 and the upper electrode 7 of the capacitor are formed simultaneously. Consequently, at the connection places in the interconnection layer of the logic circuit, contacts are formed between the lower and upper interconnection layers 2 and 6, in the capacitor region, the MIM capacitor structure is accomplished, in which the lower electrode 3 faces the upper electrode 7 with the dielectric 5 in between.

In the examples of the processes in FIG. 6, in the process ST12 eliminating a part of interlayer film, as an additional photomask in the memory embedding process with respect to the standard logic process, a piece of mask is necessary to the formation of a mask layer for making an aperture on the interlayer film 4.

Even with further addition of a photomask for eliminating the unnecessary part of the dielectric 5 used by the MIM capacitor, and/or a photomask for ion implantation for the adjustment of the threshold voltages of MOS transistors used by memory cells, the increment of photomask number is at most 3.

Next, the areas occupied exclusively by transistors and cells are explained by showing a specific example of a memory cell.

Figure 7:
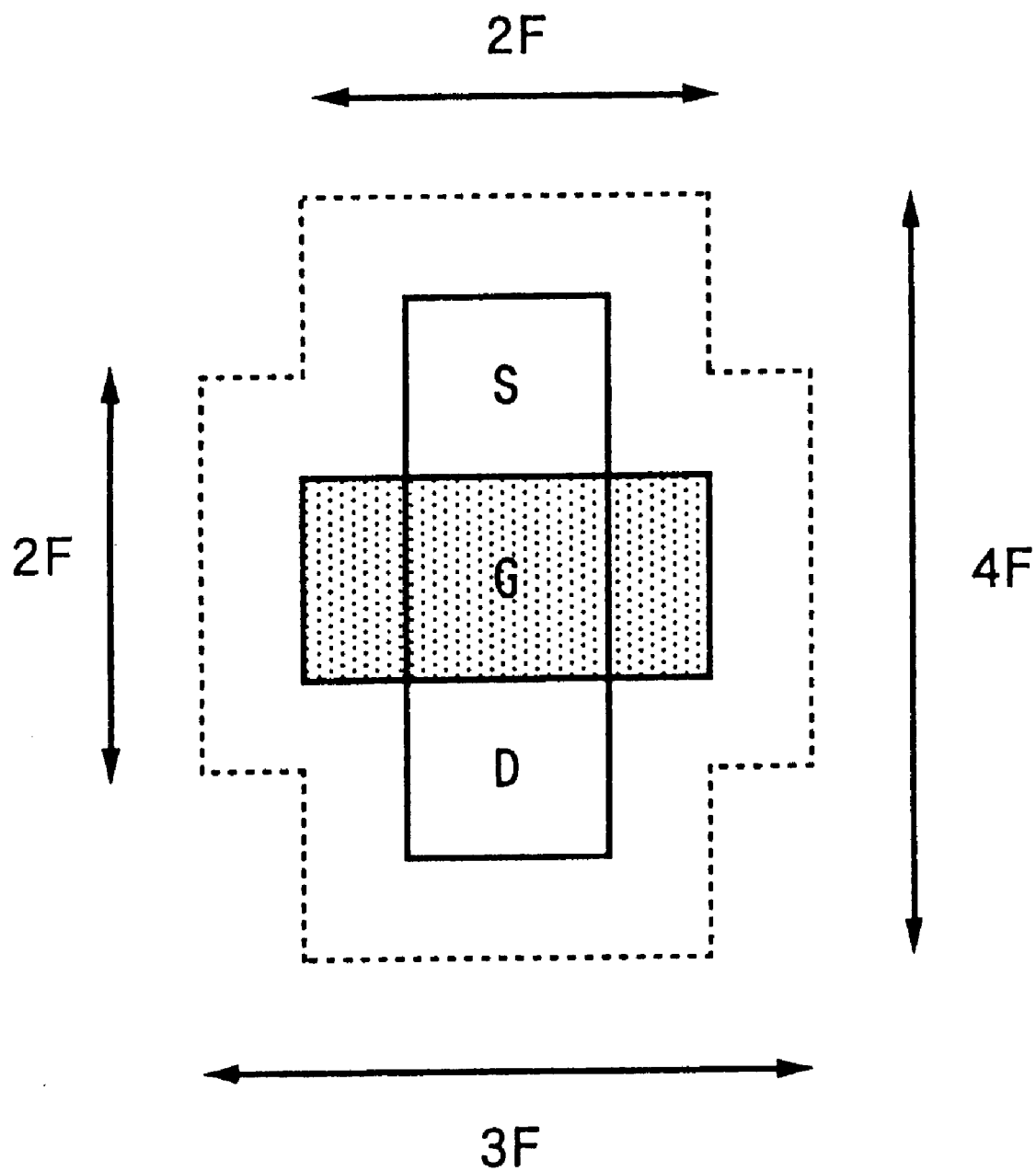
FIG. 7 is a schematic plain view showing the size of the smallest MOS transistor capable of being made by a standard logic process.

As it is known from FIG. 7, size of the smallest MOS transistor capable of being made by the standard logic process is $10F^2$. If the capacitor of a two transistor—one capacitor type gain cell is formed on the upper interconnection layer, the cell area is $20F^2$, if simply taking it as the area required for fabricating two MOS transistor.

However, in design of a cell pattern, the area can be saved by, for example, sharing the impurity region among the transistors, so, the practical cell area is able to be made smaller than $20F^2$.

FIG. 8 shows the practical structure of the two transistor—one capacitor type cell, and an example of the pattern. FIG. 8A and FIG. 8B are the plain views of the plane pattern before and after the completion of the second interconnection layer.

Below, the cell structure and the pattern is made clear together with the explanation of the fabrication process.

First, the element isolation dielectric film is formed in the surface of the semiconductor substrate using a specified pattern, this film is used as a mask, and in the region around this mask a p-type impurity is doped.

Then, for example, the gate dielectric film comprised of for example silicon oxide and the first interconnection layer comprised of poly silicon is formed and patterned. Due to this process, as shown in FIG. 8A, there are formed the write word line WWL perpendicular to the p-type impurity region and passing through between cells in word direction (the horizontal direction in the FIG. 8A), and the first local interconnection layer 20 perpendicular to the p-type impurity region and located locally in cells. In the p-type impurity region around the pattern of the first interconnection layer, an n-type impurity is introduced at a high concentration, so an n-type impurity region 21 is formed. This n-type impurity region has the interconnection part serving as the line supplying the reference potential Vss and passing through between the cells in word direction and shared by the two cells adjacent in bit direction (the vertical direction in FIG. 8A). The read transistor TR is formed in the part of p-type impurity region perpendicular to the first local interconnection layer 20 and immediately beside this interconnection part (VSS: supply line of the reference potential). And the write transistor TW is formed in the part of p-type impurity region perpendicular to the write word line WWL.

After the first interlayer dielectric film is formed and patterned, apertures used as contact holes 22 and 23 on the n-type impurity region and as contact hole 24 on the first local interconnection layer 20 are made simultaneously. Among these, contact hole 22 made on the n-type impurity region 21 immediately beside the read transistor TR is used as a part of the bit contact BC.

On the first interlayer dielectric film, the second local interconnection layer 25 and landing pad layer 26 are formed. The second local interconnection layer 25 is connected between contact holes 23 and 24, the landing pad layer 26 is overlapped on contact hole 22.

After the second interlayer dielectric film is formed and patterned, as shown in FIG. 8B, the first via holes 27 and 28 are formed. The first via hole 27 is made on the landing pad layer 26, and is used as a part of the bit contact BC. Another first via hole 28 is made on the second local interconnection layer 25.

On the second local interconnection layer 25, bit line BL in contact with the first via holes 27 and the landing pad layer 29 in contact with the second via holes 28 are formed simultaneously.

After the third interlayer dielectric film is formed and patterned, the third via hole 30 is formed on the landing pad layer 29.

On the third interconnection layer, the rectangular lower electrode 31 of the capacitor in contact with the second via holes 30 is formed.

After the capacitor dielectric film is formed, on the capacitor dielectric film, the upper electrode 32 of the capacitor is formed passing through between cells.

In this specific example, although there are many layers of interconnection, transistor TR and TW are both bulk type, performance of transistors and the uniformity are excellent.

Due to the share of the impurity regions, a cell area as small as $18F^2$ is achievable. Because the required capacitors are located above the two MOS transistors, the area is adequate, thus possession of capacitor does not cause the increase of the cell area.

From above descriptions, the technique NewCell(1) suitable to a memory embedded logic LSI which has a scale of the logic on board of 10 Kgate to 2.56 Mgate and a capacity of the memory on board of 1 Mbit to 56 Mbit has been explained with a specific example.

In the present embodiment, when the adoption of this cell technique is investigated, if comparison of the effective technique resources is made, for example, according to the procedure shown in FIG. 1, the procedure of making judgement is regulated and easy. Because comparison is able to be made between two memory regions, or two logic regions, or two other regions, it is easy to obtain the guideline to advance the improvement. For example, if the effective technique resource of the third region accounts for a relatively large percentage of the total resource, improvement of the peripheral circuits technique need be tackled. While, if the effective technique resource of the memory region is relatively large, it is necessary to consider to further share the logic process of the memory cell, or miniaturize the memory cell.

It should be stressed that for memory embedded logic LSI having a scale of logic on board in the range of 10 Kgate to 2.56 Mgate and a capacity of memory on board in the range of 1 Mbit to 56 Mbit, there also exist other techniques leading to effective technique resources less than those of SRAM or DRAM embedded LSI.

For example, investigation is able to be made for such an embedding technique which results in a zero increment of the mask number required for fabrication with respect to the standard logic LSI process (SRAM process), and a cell area of $24F^2$ (twice the DRAM, and 24/130 times as many as SRAM), and an area of the memory direct peripheral circuits same as DRAM, namely, an area of $36F^2$ for constructing one bit.

In order to make the increment of the mask number zero, for example, it is a possible choice to make the capacitor by an MOS diode. But the cell area increases by as much as that of the MOS diode. Give this technique a temporary name 'NewCell(2)'.

Figure 9:
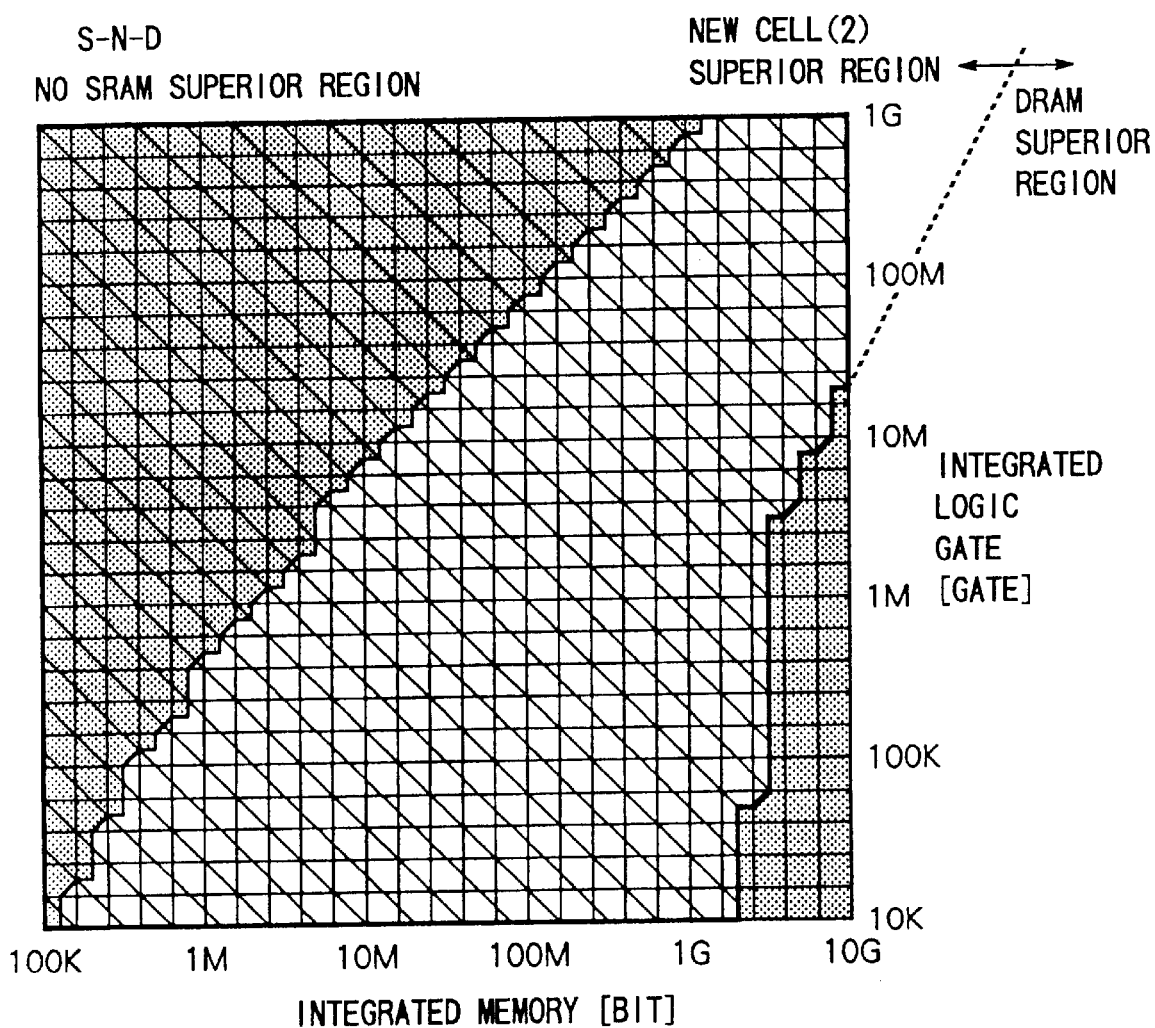
FIG. 9 is a plot in which the NewCell(2) superior region is overlapped on FIG. 2.

In investigation of the NewCell(2) technique, according to the procedure shown in FIG. 1, a region in which the sum of effective technique resources is smaller than the sum of effective technique resources of the SRAM or DRAM embedded LSI, namely, NewCell(1) technique is superior (NewCell(1) superior region) is found, and is overlapped on the SRAM or DRAM superiority map (FIG. 2), as shown in FIG. 9.

Within the scope in FIG. 9, the DRAM superior region occupies only a small area at large values of the memory capacity, while the NewCell(2) superior region occupies almost all other area. Further, the SRAM superior region does not appear. Therefore, from FIG. 9, it is found that NewCell (2) is superior to SRAM and DRAM with the scale of the logic on board in the range of 10 KGate to 2.5 MGate, and the capacity of the memory on board in the range of 1 Mbit to 256 Mbit.

Comparing FIG. 9 and FIG. 3, it is found that difference of cell structure causes a large change in extension of a superior region.

In addition, if the range of the scale of the logic on board, or the range of the capacity of the memory on board change, so change the conditions that ought to be fulfilled for an embedding technique that is able to give smaller effective technique resource than existing techniques (SPB(n), CWU (n), SP&IO(n)).

In general, it is important to reduce CWU(n) when the scale of the logic on board (NLG) is large and the capacity of the memory on board is small. On the other hand, it is also important to reduce SPB(n) when the scale of the logic on board (NLG) is small and the capacity of the memory on board (NMB) is large.

Next, an example is raised to specifically explain that the cell superior region map changes if the conditions ought to be fulfilled by a memory embedded technique change.

Here, it is assumed that the area of the third region where the I/O circuit and the pad are arranged is determined only by the scale of the logic on board and the capacity of the memory on board. Namely, if the scale of the logic circuit on board or the capacity of the memory on board are equal, the area of the third region as the technique for comparison is applied SP&IO(i) takes the same value as the area of the third region as the technique under investigation is applied SP&IO(n).

Figure 10:
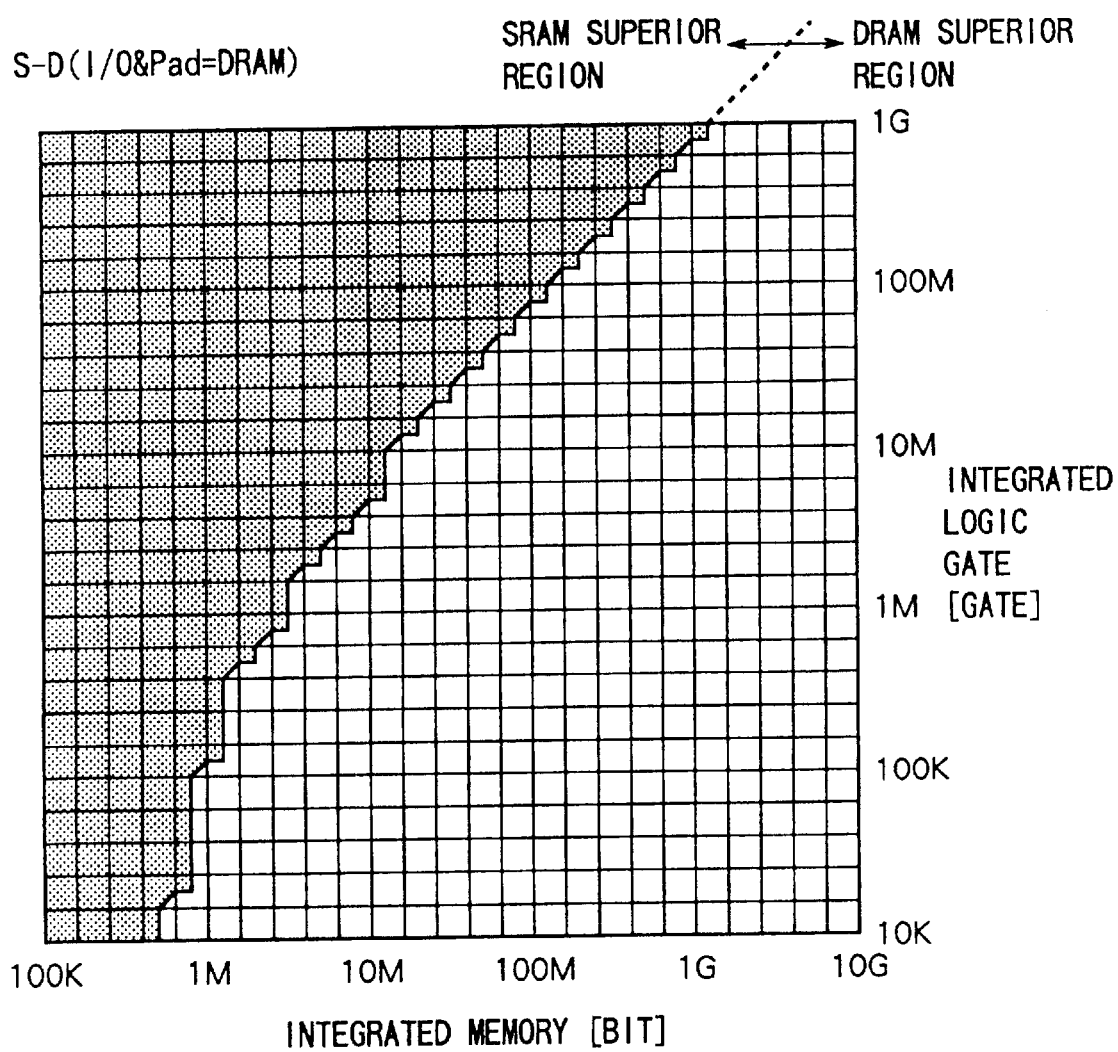
FIG. 10 is a plot showing the distribution of the technique superior region obtained by appending to FIG. 2 the condition that the area of the third regions is constant.
Figure 11:
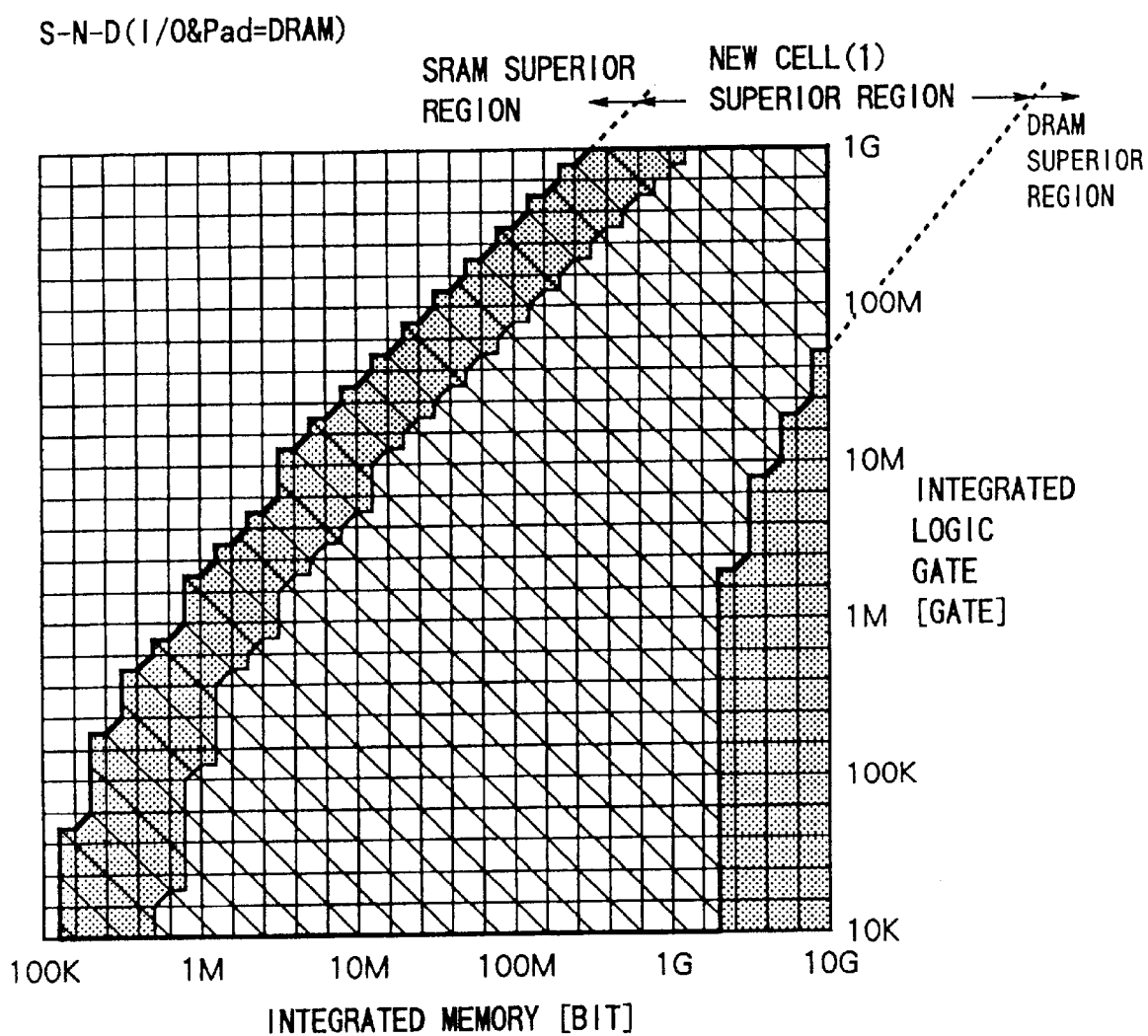
FIG. 11 is a plot showing the distribution of the technique superior region obtained by appending to FIG. 3 the condition that the area of the third regions is constant.
Figure 12:
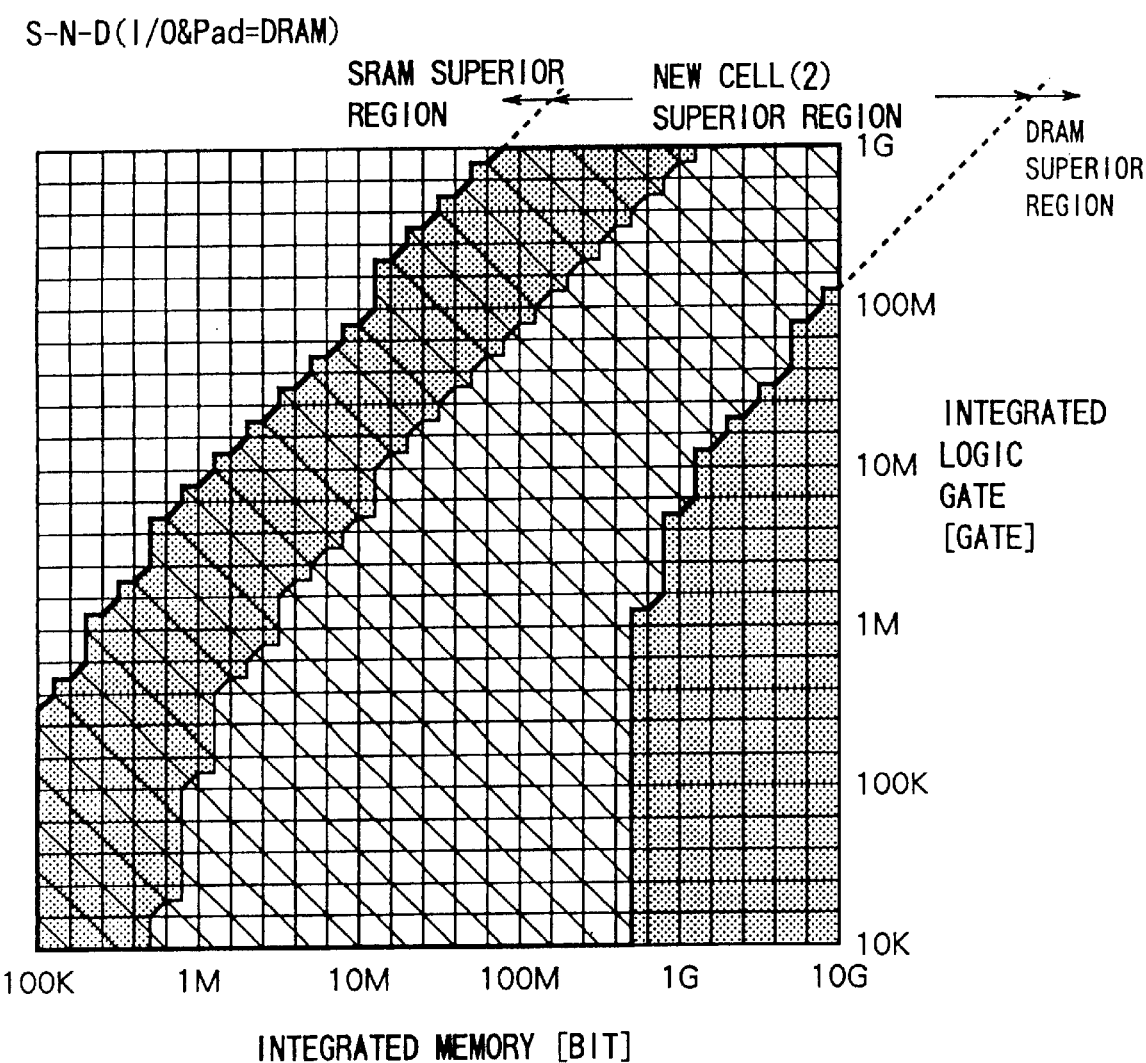
FIG. 12 is a plot showing the distribution of the technique superior region obtained by appending to FIG. 9 the condition that the area of the third regions is constant.

FIG. 10 to FIG. 12 show the map of cell superior regions after appending the condition that areas of the third regions are a constant. Here, FIG. 11 and FIG. 12 show the NewCell (1) superior region and NewCell(2) superior region overlapped on FIG. 10 respectively.

Comparing FIG. 10 with FIG. 2 on which the additional condition is not imposed, it is found that due to the additional condition, DRAM superior region is receding at large values of logic gate.

Comparing FIG. 11 with FIG. 3 on which the additional condition is not imposed, it is found that due to the additional condition, the NewCell(1) superior region enlarges at small values of the memory capacity and at large values of the logic gate, while DRAM superior region is receding there.

Comparing FIG. 12 with FIG. 9 on which the additional condition is not imposed, it is found that the SRAM superior region is fairly enlarged at small values of the memory capacity and at large values of logic gate, while the NewCell (2) superior region largely recedes, moreover, the DRAM superior region enlarges at large values of memory capacity and small values of the logic gate, while the NewCell(2) superior region is receding there.

In this way, by for example just appending the condition that the third regions have a constant area, the effective technique resources change. It is known from this that, in the field of memory embedded logic LSI technique, a superior technique does not only depend on the memory cell structure and size, but also on the area of the memory direct-used peripheral circuits (scale of the circuit) and the area of the I/O and pad region, and further on the scale of logic gates on board and the capacity of memory on board. It is made clear that it is necessary to select the most suitable technique with respect to the combination of above factors.

In the present embodiment, although the technique under investigation is assumed to be gain cell, it is certain that the method in the present invention is applicable to the investigation of memory cells of different structure.

In addition, the techniques for comparison are not limited to SRAM and DRAM, either.

Furthermore, the method of investigating techniques related to the present embodiment is applicable to other technique selection in design and in fabrication.

Summarizing the effects of the present invention, according to the method for designing a memory embedded semiconductor integrated circuit, during the development of a memory embedded semiconductor integrated circuit, the conditions for the required element techniques to be technically superior are clarified, and it becomes easy to establish the guideline for development to make techniques superior.

In addition, the memory embedded semiconductor integrated circuit related to the present invention, to whom the same method is applied, fulfills the requirements of technique superiority.

What is claimed is:

1. A method for designing a memory embedded semiconductor integrated circuit having a first region where logic gates are formed, a second region where memory cells are formed, and a third region including all other regions but the first region and the second region, said method comprising the steps of:

defining a total resource of a fabrication technique by utilizing various numerical values represented by a process number or mask number required for fabricating the memory embedded semiconductor integrated circuit;

deducing a unit resource by dividing said total resource by a total effective wafer area;

defining a first effective technique resource, a second effective technique resource, and a third effective technique resource by multiplying said unit resource by the area of the first region, the area of said second region, and the area of said third region, respectively;

comparing a plurality of techniques concerning fabrication and/or design by using the first to the third effective technique resources obtained as these techniques are employed; and selecting from said plurality of techniques those suitable to the required scales of the memory and the logic circuit.

2. A method for designing a memory embedded semiconductor integrated circuit according to claim 1, comprising the steps of:

subtracting the effective technique resources of the techniques for comparison from the effective technique resources of the technique under investigation and deducing the differences with respect to each of the first to the third effective technique resources; and adopting the technique under investigation under the condition that the sum of the differences over the first to the third regions is negative.

3. A method for designing a memory embedded semiconductor integrated circuit according to claim 2, comprising the steps of:

denoting the following equation (1) by the following procedures;

$$[CWU(n) \times SPLG(n) - CWU(i) \times SPLG(i)] \times \\ NLG + [CWU(n) \times SPB(n) - CWU(i) \times SPB(i)] \times \\ NMB + [CWU(n) \times SP\&IO(n) - CWU(i) \times SP\&IO(i)] < 0 \qquad (1)$$

(a) by CWU(n) the unit resource obtained by dividing the total resource of the fabrication technique by the effective wafer area when said memory embedded semiconductor integrated circuit is fabricated by using technique N that is under investigation, (b) CWU(i) said unit resource when performing fabrication using the i-th technique I among a number of m (m: a natural number) techniques that are for comparison, (c) SPLG(n) the area per logic gate in said first region when technique N is employed, (d) SPLG(i) the area per logic gate in said first region as technique I is employed, (e) SPB(n) the area per memory bit in said second region as technique N is employed, (f) SPB(i) the area per memory bit in said second region as technique I is employed, (g) SP&IO(n) the area of said third region as technique N is employed, (h) SP&IO(i) the area of said third region as technique I is employed, (i) NLG the total number of the logic gates in said first region, and (j) NMB the total number of the memory bits in said second region; and adopting the technique N under the condition of satisfying the equation (1).

4. A method for designing a memory embedded semiconductor integrated circuit according to claim 3, comprising a step of, adopting said technique N under the condition of satisfying the equation (2), replacing equation (1), $$[CWU(n) - CWU(i)] \times SPLG \times NLG + \quad (2)$$
$$[CWU(n) \times SPB(n) - CWU(i) \times SPB(i)] \times NMB + [CWU(n) \times$$
$$SP\&IO(n) - CWU(i) \times SP\&IO(i)] < 0$$

when the areas per logic gate SPLG(n) and SPLG(i) being equal, and denoting this area by SPLG.

5. A method for designing a memory embedded semiconductor integrated circuit according to claim 3, comprising the steps of:

denoting the area of the third region by SP&IO when SP&IO(n) is equal to SP&IO(i); and adopting said technique N under the condition of satisfying the equation (3), replacing equation (1), $$[CWU(n) \times SPLG(n) - CWU(i) \times SPLG(i)] \times \quad (3)$$
$$NLG + [CWU(n) \times SPB(n) - CWU(i) \times SPB(i)] \times$$
$$NMB + [CWU(n) - CWU(i)] \times SP\&IO(NLG, NMB) < 0$$

when there are almost not differences in the scales of the logic on board in said first region and in the capacities of the memories on board in said second region, no matter which of technique N and technique I is employed.

6. A method for designing a memory embedded semiconductor integrated circuit according to claim 4, comprising the steps of:

denoting the area of the third region by SP&IO when SP&IO(n) is equal to SP&IO(i); and adopting said technique N under the condition of satisfying the equation (4), replacing equation (2), $$[CWU(n) - CWU(i)] \times SPLG \times NLG + \quad (4)$$
$$[CWU(n) \times SPB(n) - CWU(i) \times SPB(i)] \times$$
$$NMB + [CWU(n) - CWU(i)] \times SP\&IO(NLG, NMB) < 0$$

when there are almost not differences in the scales of the logic on board in said first region and in the capacities of the memories on board in said second region, no matter which of technique N and technique I is employed.

7. A method for designing a memory embedded semiconductor integrated circuit according to claim 1, comprising the steps of:

specifying a technique among all the techniques under investigation and techniques for comparison;

subtracting the effective technique resources of any technique else from the effective technique resources of said specific technique to deduce the differences for each of the first to the third effective technique resources;

summing the differences over said first to the third effective technique resources;

repeating above subtraction and summation by changing the specified technique and another technique in the subtraction one by one among said all techniques; and adopting the specific technique under the condition that said sum is minimum.

8. A method for designing a memory embedded semiconductor integrated circuit according to claim 1, wherein the technique concerning said fabrication and/or design includes the circuit type and configuration of a memory cell, as well as the fabrication process that accompanies the adoption of the circuit type and configuration.

9. A memory embedded semiconductor integrated circuit comprising:

a first region wherein a logic gate array is formed;

a second region wherein a memory cell array is formed; and a third region other than the first region and the second region, and wherein said circuit fulfills the condition of satisfying the equation (1), that is, $$[CWU(n) \times SPLG(n) - CWU(i) \times SPLG(i)] \times NLG + \quad (1)$$
$$[CWU(n) \times SPB(n) - CWU(i) \times SPB(i)] \times NMB +$$
$$[CWU(n) \times SP\&IO(n) - CWU(i) \times SP\&IO(i)] < 0$$

where,

CWU(n) denotes the unit resource, which is defined as the division by the effective wafer area of the fabrication technique total resource represented by the process number and/or the mask number required for fabricating said memory embedded semiconductor integrated circuit using technique N that is under investigation, CWU(i) denotes the unit resource when using for fabrication the ith technique I among a number of m (m: a natural number) techniques that are for comparison, SPLG(n) is the area per logic gate of said first region as technique N is employed, SPLG(i) is the area per logic gate of said first region as technique I is employed, SPB(n) is the area per memory bit of said second region as technique N is employed, SPB(i) is the area per memory bit of said second region as technique I is employed, SP&IO(n) is the area of said third region as technique N is employed, SP&IO(i) is the area of said third region as technique I is employed, NGL is the total number of the logic gates in said first region, and NMB is the total number of the memory bits in said second region.

10. A memory embedded semiconductor integrated circuit according to claim 9, wherein:

the areas per logic gate SPLG(n) and SPLG(i) are equal where this area is denoted by SPLG; and equation (2) replacing said equation (1), $$[CWU(n) - CWU(i)] \times SPLG \times NLG + \quad (2)$$
$$[CWU(n) \times SPB(n) - CWU(i) \times SPB(i)] \times NMB + [CWU(n) \times$$
$$SP\&IO(n) - CWU(i) \times SP\&IO(i)] < 0$$

holds true.

11. A memory embedded semiconductor integrated circuit according to claim 9, wherein:

there are almost not differences in the scales of the logic on board in said first region and the capacities of the memories on board in said second region, no matter which of technique N and technique I is employed;

areas of the third regions SP&IO(n) and SP&IO(i) are equal where this area is denoted by SP&IO; and the equation (3) replacing said equation (1), $$[CWU(n) \times SPLG(n) - CWU(i) \times SPLG(i)] \times \\ NLG + [CWU(n) \times SPB(n) - CWU(i) \times SPB(i)] \times \\ NMB + [CWU(n) - CWU(i)] \times SP\&IO(NLG, NMB) < 0 \quad (3)$$

holds true.

12. A memory embedded semiconductor integrated circuit according to claim 10, wherein:

there are almost not differences in the scales of the logic on board in said first region and the capacities of the memories on board in said second region, no matter which of technique N and technique I is employed;

the areas of the third regions SP&IO(n) and SP&IO(i) are equal where denote this area by SP&IO; and the equation (4) replacing said equation (2), $$[CWU(n) - CWU(i)] \times SPLG \times NLG + \\ [CWU(n) \times SPB(n) - CWU(i) \times SPB(i)] \times \\ NMB + [CWU(n) - CWU(i)] \times SP\&IO(NLG, NMB) < 0 \quad (4)$$

holds true.

13. A memory embedded semiconductor integrated circuit according to claim 9, wherein:

the number of the total logic gates in said first region NLG has a minimum NLGmin and a maximum NLGmax within the region in which said equation (1) holds; and the number of the total memory bits in said second region NMB has a minimum NMB min and a maximum NMBmax within the region in which said equation (1) holds.

14. A memory embedded semiconductor integrated circuit according to claim 9, wherein the fabrication technique N thereof under investigation and the fabrication technique I thereof for comparison including the circuit type and configuration of a memory cell therein, as well as the fabrication process thereof accompanying the adoption of this circuit type and configuration thereof.

* * * * *